(12) United States Patent
Wells et al.

(10) Patent No.: US 9,829,915 B2
(45) Date of Patent: Nov. 28, 2017

(54) MODULAR PRINTED CIRCUIT BOARD

(71) Applicant: Intel Corporation, Santa Clara, CA (US)

(72) Inventors: Kevin E. Wells, Placerville, CA (US); Richard C. Stamey, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 38 days.

(21) Appl. No.: 14/496,876

(22) Filed: Sep. 25, 2014

(65) Prior Publication Data

US 2015/0373847 A1 Dec. 24, 2015

Related U.S. Application Data

(60) Provisional application No. 62/013,808, filed on Jun. 18, 2014.

(51) Int. Cl.
*H05K 1/11* (2006.01)
*H05K 3/42* (2006.01)
(Continued)

(52) U.S. Cl.
CPC ............ *G06F 1/16* (2013.01); *H05K 1/141* (2013.01); *H05K 3/3436* (2013.01);
(Continued)

(58) Field of Classification Search
CPC ...... H05K 1/115; H05K 1/0216; H05K 7/023; H05K 3/36; H05K 3/421; G06F 1/16
(Continued)

(56) References Cited

U.S. PATENT DOCUMENTS 3,868,770 A * 3/1975 Davis ................... H05K 3/4084
174/261
4,391,909 A 7/1983 Bohn et al.
(Continued)

FOREIGN PATENT DOCUMENTS

CN 201409148 * 2/2010
CN 201409148 Y * 2/2010
(Continued)

OTHER PUBLICATIONS

International Search Report and Written Opinion mailed Aug. 21, 2015 for International Application No. PCT/US2015/029929, 13 pages.
(Continued)

*Primary Examiner* — Timothy Thompson
*Assistant Examiner* — Charles Pizzuto
(74) *Attorney, Agent, or Firm* — Schwabe, Williamson & Wyatt, P.C.

(57) ABSTRACT

Described are apparatuses for modular printed circuit boards (PCB) and methods for producing modular PCBs. An apparatus may include a first PCB module with a first pattern of routing structures on one or more layers of the first PCB module. The apparatus may further include a second PCB module with a second pattern of routing structures on one or more layers of the second PCB module. The second pattern of routing structures may be aligned with and electrically coupled to the first pattern of routing structures without connectors. Other embodiments may be described and/or claimed.

14 Claims, 7 Drawing Sheets

(51) Int. Cl.
*G06F 1/16* (2006.01)
*H05K 3/36* (2006.01)
*H05K 1/02* (2006.01)
*H05K 7/02* (2006.01)
*H05K 3/34* (2006.01)
*H05K 1/14* (2006.01)

(52) U.S. Cl.
CPC ...... *H01L 2924/0002* (2013.01); *H05K 1/115* (2013.01); *H05K 3/421* (2013.01); *H05K 2201/041* (2013.01); *H05K 2201/10719* (2013.01); *Y02P 70/613* (2015.11); *Y10T 29/49128* (2015.01)

(58) Field of Classification Search
USPC ................ 174/262; 361/679.31, 735; 29/830
See application file for complete search history.

(56) References Cited

U.S. PATENT DOCUMENTS

| | | | |
|---|---|---|---|
| 5,783,870 A | 7/1998 | Mostafazadeh et al. | |
| 6,101,100 A | 8/2000 | Londa | |
| 6,195,268 B1 | 2/2001 | Eide | |
| 6,414,850 B1 | 7/2002 | Kozak et al. | |
| 7,019,221 B1 * | 3/2006 | Noda | H05K 1/141 174/255 |
| 8,018,738 B2 | 9/2011 | Doblar et al. | |
| 8,174,106 B2 | 5/2012 | Coteus et al. | |
| 8,446,738 B2 | 5/2013 | Colbert et al. | |
| 8,872,333 B2 * | 10/2014 | Lopez | H01L 23/13 257/705 |
| 2003/0193793 A1 * | 10/2003 | Dent | H05K 1/142 361/785 |
| 2006/0055017 A1 | 3/2006 | Cho et al. | |
| 2006/0250308 A1 | 11/2006 | Pinel et al. | |
| 2008/0043441 A1 | 2/2008 | Tuominen et al. | |
| 2009/0243115 A1 * | 10/2009 | Lee | G11C 5/02 257/773 |
| 2012/0206213 A1 * | 8/2012 | Kojima | H01P 5/107 333/26 |
| 2014/0111951 A1 * | 4/2014 | Standing | H05K 1/0207 361/748 |
| 2015/0036305 A1 | 2/2015 | Nanjo | |

FOREIGN PATENT DOCUMENTS

| | | | |
|---|---|---|---|
| CN | 203535549 | * | 4/2014 |
| CN | 203535549 U | * | 4/2014 |
| JP | 11067040 | * | 3/1999 |
| JP | 2010-245288 A | | 10/2010 |
| JP | 2014-060202 A | | 4/2014 |

OTHER PUBLICATIONS

International Search Report and Written Opinion mailed Apr. 28, 2017 for International Application No. PCT/US2017/013780, 14 pages.

* cited by examiner

MODULAR PRINTED CIRCUIT BOARD

RELATED APPLICATION

This application claims the benefit of U.S. Provisional Application No. 62/013,808 filed Jun. 18, 2014, entitled, "TECHNOLOGIES FOR ACCELERATING PRINTED CIRCUIT BOARD MANUFACTURING", the entirety of which is incorporated herein by reference.

FIELD OF THE INVENTION

The present disclosure relates generally to the technical field of computing, and more particularly, to modular printed circuit boards and methods for making and/or using them.

BACKGROUND

The background description provided herein is for the purpose of generally presenting the context of the disclosure. Unless otherwise indicated herein, the materials described in this section are not prior art to the claims in this application and are not admitted to be prior art or suggestions of the prior art, by inclusion in this section.

A Printed circuit board (PCB) may provide a non-conductive substrate to mechanically support and electrically connect electronic components secured on the PCB, e.g., using conductive vias, tracks, pads, or other routing features. As the complexity of circuits has increased over the years, more complex PCBs have emerged. For example, to accommodate the complex circuit design, PCBs may include multiple layers of interconnects (e.g., traces) and various vias interconnecting the various layers. Advanced PCBs may also contain capacitors, resistors or active devices embedded in the substrate. As the complexity and design type of PCBs increase, the overall cost of the electronic components also increases.

BRIEF DESCRIPTION OF THE DRAWINGS

Embodiments will be readily understood by the following detailed description in conjunction with the accompanying drawings. The concepts described herein are illustrated by way of example and not by way of limitation in the accompanying figures. For simplicity and clarity of illustration, elements illustrated in the figures are not necessarily drawn to scale. Where considered appropriate, like reference labels designate corresponding or analogous elements.

DETAILED DESCRIPTION

Figure 1:
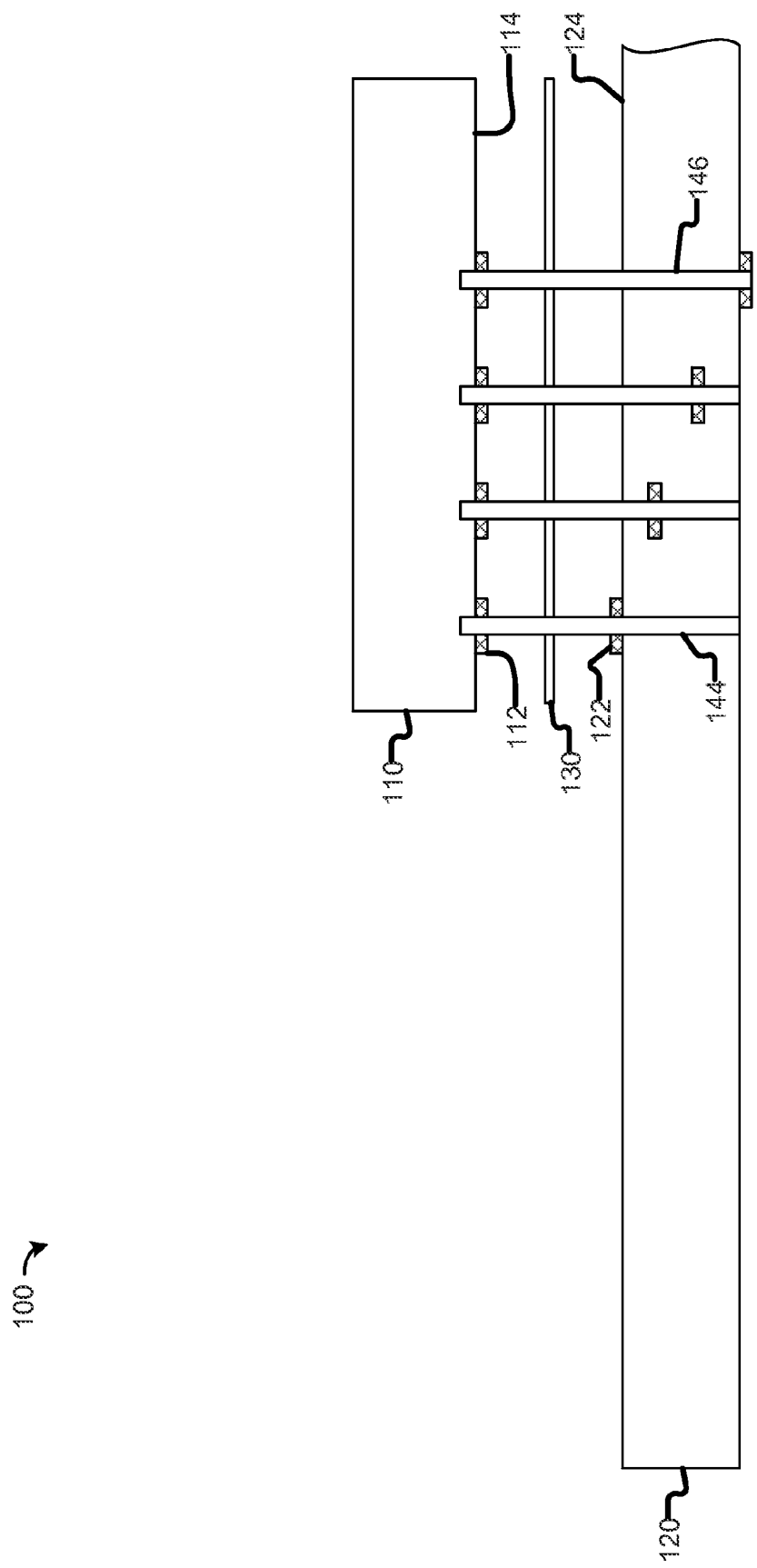
FIG. 1 is a schematic cross-sectional view illustrating an example modular PCB incorporating aspects of the present disclosure, in accordance with various embodiments.

Embodiments of apparatuses and methods related to modular printed circuit boards (PCB) are described. In embodiments, a modular PCB may include a first PCB module with a first pattern of routing structures on a layer of the first PCB module. The modular PCB may further include a second PCB module with a second pattern of routing structures, on a layer of the second PCB module, aligned with and electrically coupled to the first pattern of routing structures without connectors. These and other aspects of the present disclosure will be more fully described below.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, it may not be included or may be combined with other features.

Referring now to FIG. 1, a schematic cross-sectional view illustrating example modular PCB 100 incorporating aspects of the present disclosure is shown, in accordance with various embodiments. Modular PCB 100 may include PCB module 110 and PCB module 120. In some embodiments, PCB module 110 may include one or more processors and memory, and PCB module 120 may include various input/output (IO) components or a baseboard management controller (BMC).

In various embodiments, PCB modules 110 and 120 may be bonded to each other based on bonding layer 130. In various embodiments, PCB module 110 may be fabricated separately from PCB module 120 before they are bonded together. In some embodiments, bonding layer 130 may include pre-impregnated composite fibers (pre-preg) with epoxy resin, where the fibers and the epoxy resin may form a weave to bond adjacent materials together.

In some embodiments, PCB module 110 may share a common via pad pattern with PCB module 120. As an example, pad 112 and pad 122 may form a corresponding via pad pair. In a post lamination process, PCB module 110 may be aligned with PCB module 120 based at least in part on at least one mass lamination registration hole (not shown). Then, bonding layer 130 may mechanically bond the two PCB modules. Further, one or more vias may be drilled and plated to electrically couple the two PCB modules, e.g., through their common pad pairs. In various embodiments, bonding layer 130 may be only partially cured, and the PCB modules and bonding layer 130 may be placed in an oven or autoclave to allow bonding layer 130 to be cured when heat accelerates its polymerization process.

In various embodiments, the outermost layer 114 of PCB module 110 may have a smaller surface area than the outmost layer 124 of PCB module 120. Therefore, modular PCB 100 may have at least two regions with different heights. For example, the combined height of PCB module 110 and PCB module 120 is greater than PCB module 120 alone. In various embodiments, although PCB module 110 may have a smaller footprint, PCB module 110 may be more difficult or costly to manufacture for various reasons, such as it may include a greater signal routing density or have a higher layer count. As an example, when PCB module 110 hosts processors and memory together, it may include a six-layer profile. In some embodiments, PCB module 110 may host one or more processors. In other embodiments, various processors may be separately situated in multiple PCB modules, which may be all secured to PCB module 120.

PCB module 120 may be fabricated partially separately from PCB module 110, and may be manufactured with less complexity, as it may include less dense signal routing and a lower layer count. Accordingly, PCB module 110 and PCB module 120 may use different PCB materials that are suitable for the signals routed on the respective module. As an example, PCB module 110 may utilize PCB materials more suitable for higher signal routing density, higher power density, or higher layer count compared to what may be used for PCB module 120.

In various embodiments, PCB module 110 may include a first PCB material with a first loss factor; and PCB module 120 may include a second PCB material with a second loss factor that is lower than the first loss factor. In some embodiments, PCB module 120 may contain high-speed IO connectors, a platform controller hub (PCH), a BMC, voltage regulators (VR), sensors, or power connectors. In some embodiments, PCB module 120 with IO connectors and a BMC board may include signals that operate at five gigahertz (5 GHz) or greater, such as Universal Serial Bus (USB) 3.0, Peripheral Component Interconnect Express (PCIe) 2.0/3.0, QuickPath Interconnect (QPI), Serial ATA (SATA), Serial Attached SCSI (SAS), etc. PCB module 110 with processors and memory, on the other hand, may be configured for handling less than 5 GHz signal routing. Therefore, PCB module 120 may use a lower-loss PCB material than PCB module 110 may use.

In various embodiments, a routing feature may be manufactured to route signals between PCB module 110 and PCB module 120 after the modules are bonded together. As an example, via 144 and via 146 may be drilled through PCB module 120, and extended to PCB module 110. In some embodiments, vias may be drilled from either PCB module 110 or PCB module 120. In some embodiments, vias may be drilled through one PCB module or both PCB modules. Signals may then be routed through these cross-module vias if such signals need to be routed between PCB module 110 and PCB module 120.

Modular PCB 100 disclosed herein may be used to accelerate PCB development while reducing total PCB cost for complex multi-layer PCB designs such as PCBs designated for server-class products. Implementing the technologies disclosed herein allows a PCB design engineer to route portions of a product design on different modules and then combine the modules during PCB manufacturing to form a multi-module PCB for the product. A PCB design engineer may reuse previously designed complex PCB modules while avoiding having to retest the previously characterized PCB modules. This allows the PCB design engineer to increase the IO density in a PCB and improve signal integrity characteristics of high speed signals without utilizing expensive interconnect technologies like blind vias (e.g., vias that connect a PCB outer layer to a PCB internal layer) and buried vias (e.g., vias connecting two internal layers). Modular PCB 100 thus may provide an alternative to the extensive use of blind and buried vias, e.g., in Type 4 PCB technology, which is commonly seen in small footprint PCBs such as those used in mobile communication devices.

Modular PCB 100 may be used in a server baseboard design to provide various improvements and/or advantages over traditional server PCB design. In other embodiments, such improvement and/or advantages may also be realized on other types of complex PCB designs. Complex server baseboard PCBs are typically larger than mobile phone PCBs for various reasons. For example, server processors, memory, and network devices are typically at least ten times larger than their respective counterparts on mobile phones. Further, the number of IO signals on a server baseboard may be dramatically higher than that on a mobile phone PCB because of the greater number of processor IO signals, memory IO signals, and network IO signals in a server PCB. As an example, the number of IO signals in a server-class baseboard may be fifty times more than what is on a mobile phone PCB. Moreover, in some embodiments, server PCB components may consume more than a hundred times the power consumed by a mobile phone PCB. In that sense, the total power supported by a server baseboard is typically greater than a mobile phone PCB because server components typically consume more power than mobile phone components. Typical mobile phone designs use Type 4 PCB technology. However, Type 4 PCB technology, when applied to a server baseboard, often increases the cost of the server baseboard by at least a factor of two for various reasons, such as the server baseboard may require ten to a hundred times more vias for increased signal routing density and/or intensity, more surface area, higher cost dielectric materials, or much lower production volume.

Current design trends of server-class PCBs typically require the use of blind and buried vias to increase the signal quality of high-speed signals and increase routing density. However, use of the technologies described herein may allow a PCB design engineer to avoid or reduce blind and buried vias while still increasing the signal quality of high-speed signals as well as routing density. In various embodiments, the modular PCB design described herein may be two to three times less expensive than using blind and buried vias on server-class PCBs.

Figure 2:
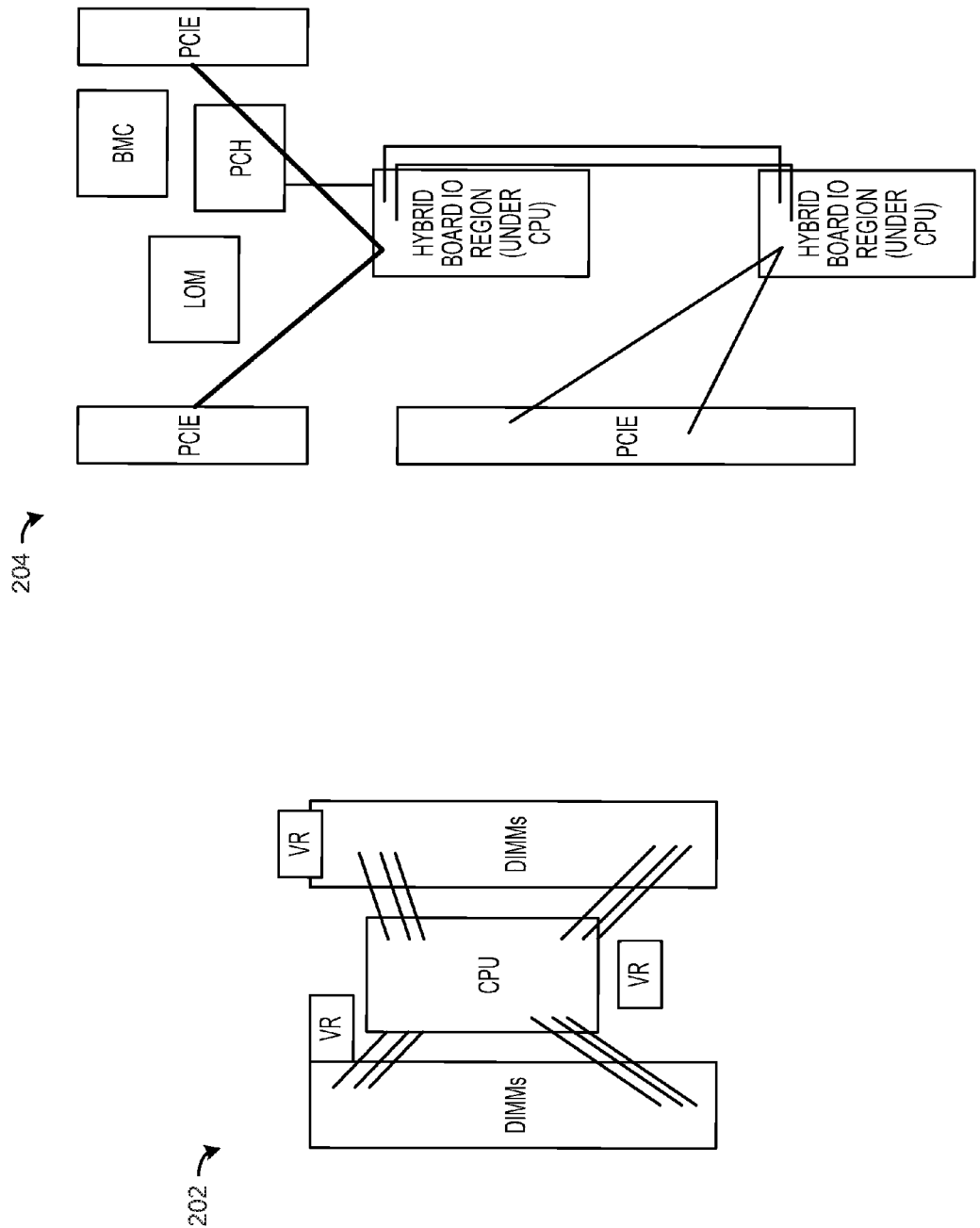
FIG. 2 is a schematic block diagram illustrating an example computing device incorporating aspects of the present disclosure, in accordance with various embodiments.

FIG. 2 is a schematic block diagram illustrating an example computing device incorporating aspects of the present disclosure, in accordance with various embodiments. In embodiments, PCB module 202 may include a processor and associated memory, while PCB module 204 may include various IO components and a BMC.

In various embodiments, a complex PCB design may be separated into multiple less-complex modules that, when combined using the technologies described herein, form a finished product. The less-complex modules, e.g., PCB module 204, may be fabricated using standard high-volume and low-cost PCB technologies typically used in servers PCBs. The more-complex modules, e.g., PCB module 202, which may be fabricated using higher cost PCB technologies as compared to the cost for fabricating PCB module 204, come with greater reusability. For example, PCB module 202 may be reused to couple to various different less-complex PCB modules as long as they are designed to be compatible with a known interface to PCB module 202. Consequently, the disclosed technologies may simplify the design of a server or other computing devices.

Moreover, as depicted in FIG. 2, signals may be routed among various components within PCB module 202 or PCB module 204. Therefore, modular PCB technologies disclosed herein may alleviate the need in a traditional design of a server PCB where IO signals may need to be routed through regions where high current IO voltage regulators or memory modules exist. Further, modular PCB technologies disclosed herein may also alleviate the need of the parallel routing of PCIe and/or memory signals on adjacent layers in a typical server PCB board. Therefore, even a complex server PCB may be designed with a profile with less than twelve layers by utilizing the modular PCB technologies.

Figure 6:
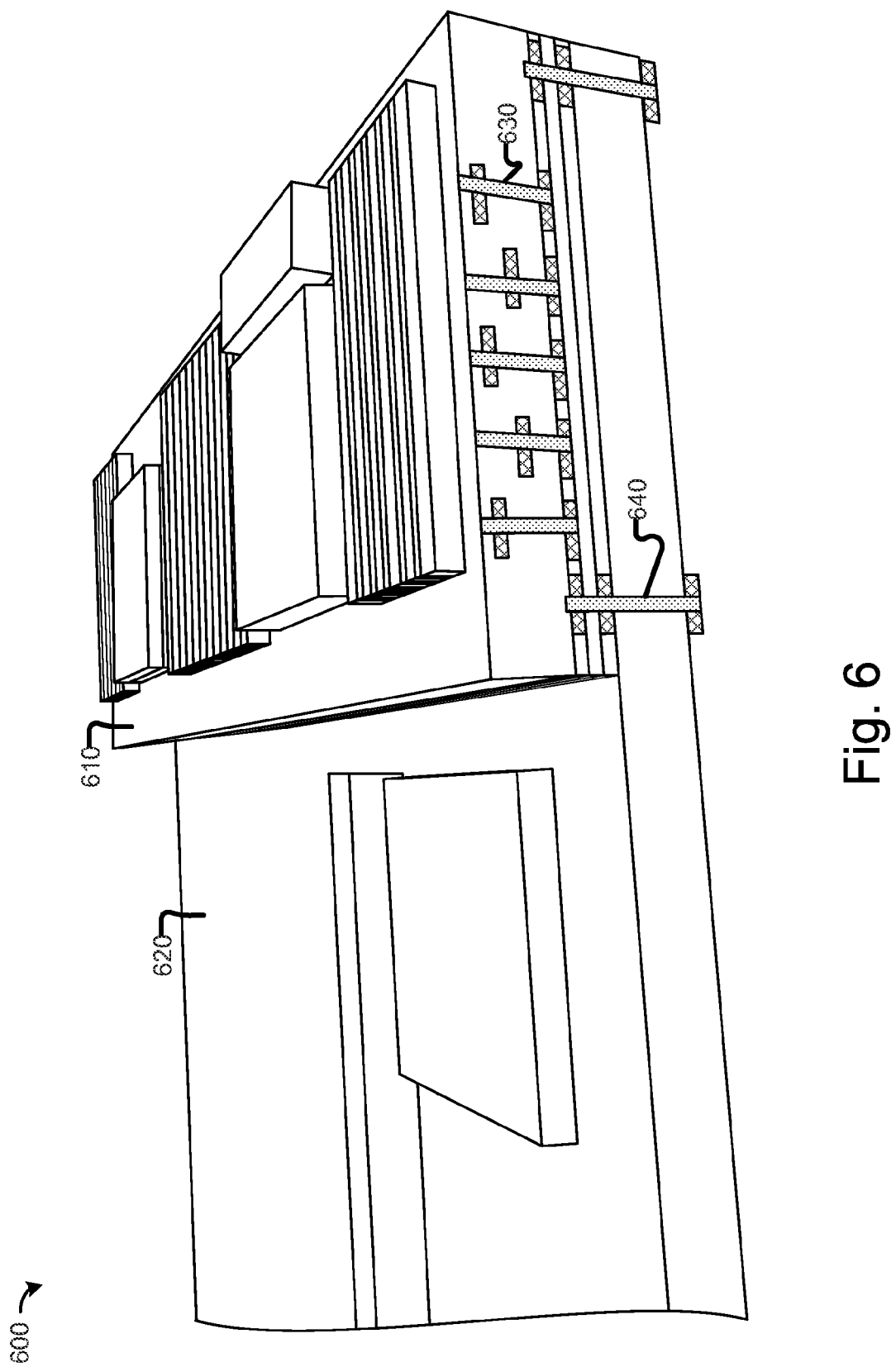
FIG. 6 is a schematic diagram of at least yet another embodiment of a computing device having a modular PCB incorporating aspects of the present disclosure, in accordance with various embodiments.

In various embodiments, many vias of a particular PCB module do not intrude on routing channels or ground and power planes of another PCB module. Buried and blind vias may still be used within an individual module, but they are not needed to route signals from one PCB module to another, for example, as illustrated in FIG. 6. Resultantly, the finished PCB may have fewer vias extending between the individual modules because many vias may be isolated to one of the modules.

Figure 3:
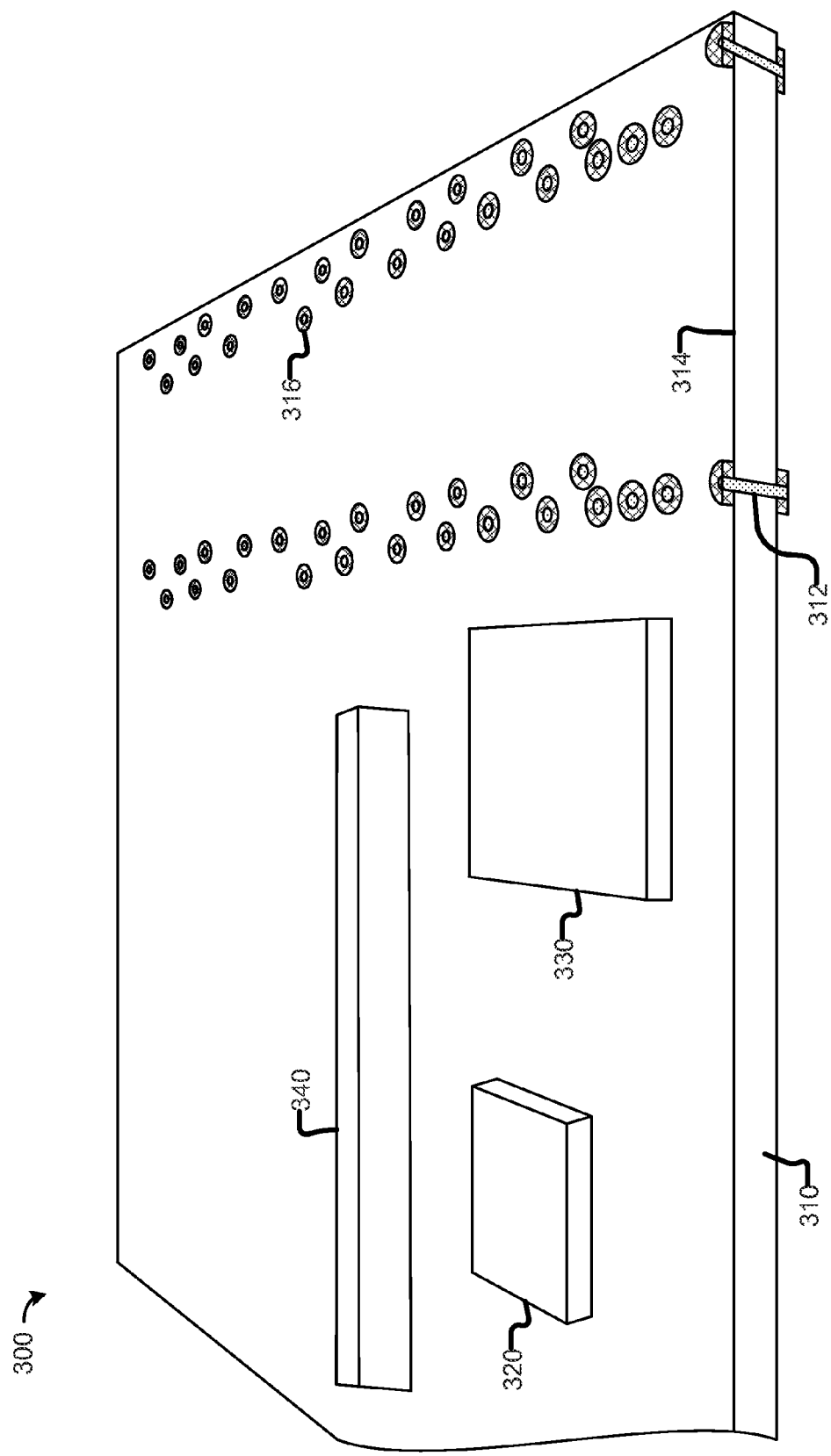
FIG. 3 is a schematic partially exposed view illustrating an example lamination via pattern on a PCB module incorporating aspects of the present disclosure, in accordance with various embodiments.

FIG. 3 is a schematic partially exposed view illustrating an example lamination via pattern 316 on PCB module 300 incorporating aspects of the present disclosure, in accordance with various embodiments. In embodiments, PCB module 300 may include BMC 320, PCH 330, and Peripheral Component Interconnect (PCI) 340, hosted on substrate 310. Substrate 310 may include lamination via pattern 316 defined on side 314 of the substrate. Lamination via pattern 316 may be uniquely designed in different embodiments.

In embodiments, lamination via pattern 316 may be shared by another PCB module, such as PCB module 110 in connection with FIG. 1. In some embodiments, a shared lamination via pattern may include corresponding via pads on two PCB modules, wherein each via pad of one PCB module may be coupled to a respective via pad of another PCB module. In some embodiments, lamination via pattern 316 may only include either a subset or a superset of via pads on a counterpart PCB module when only the subset or the superset of via pads need to be connected in that particular embodiment. In various embodiments, lamination via pattern 316 may be aligned with and electrically coupled to its corresponding lamination via pattern on another PCB module without connectors (e.g., bumps, pillars, etc.), such as based only on a lamination layer to bond the two PCB modules together and vias subsequently drilled and plated to create the electrical connection.

In various embodiments, mass lamination registration hole 312 may be used to facilitate such coupling of two PCB modules. In some embodiments, the area containing mass lamination registration hole 312 may be scrapped away from PCB module 300 once two PCB modules are coupled to each other. Mass lamination registration hole 312 may be aligned with and coupled to a corresponding mass lamination registration hole on another PCB module based on a mass lamination pin (not shown). Resultantly, the lamination via patterns on the two PCB modules may be in alignment with each other when another PCB module is placed on top of PCB module 300. In some embodiments, metal may be electroplated on the vias connecting aligned pads of two PCB modules. Therefore, an individual pad of lamination via pattern 316 may be electrically coupled to a corresponding individual via pad on another PCB module.

Figure 4:
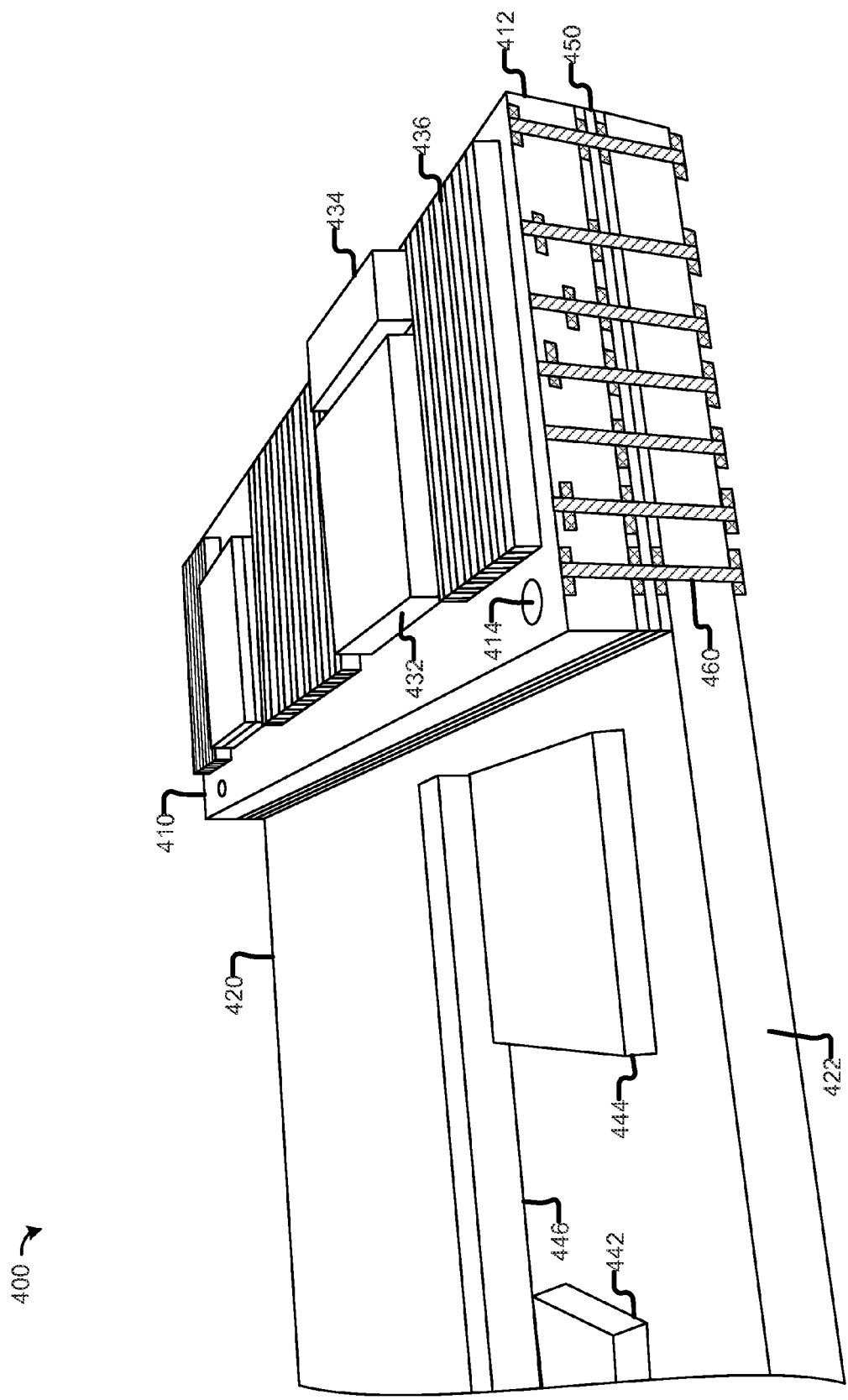
FIG. 4 is a schematic diagram of at least one embodiment of a computing device having a modular PCB incorporating aspects of the present disclosure, in accordance with various embodiments.
Figure 5:
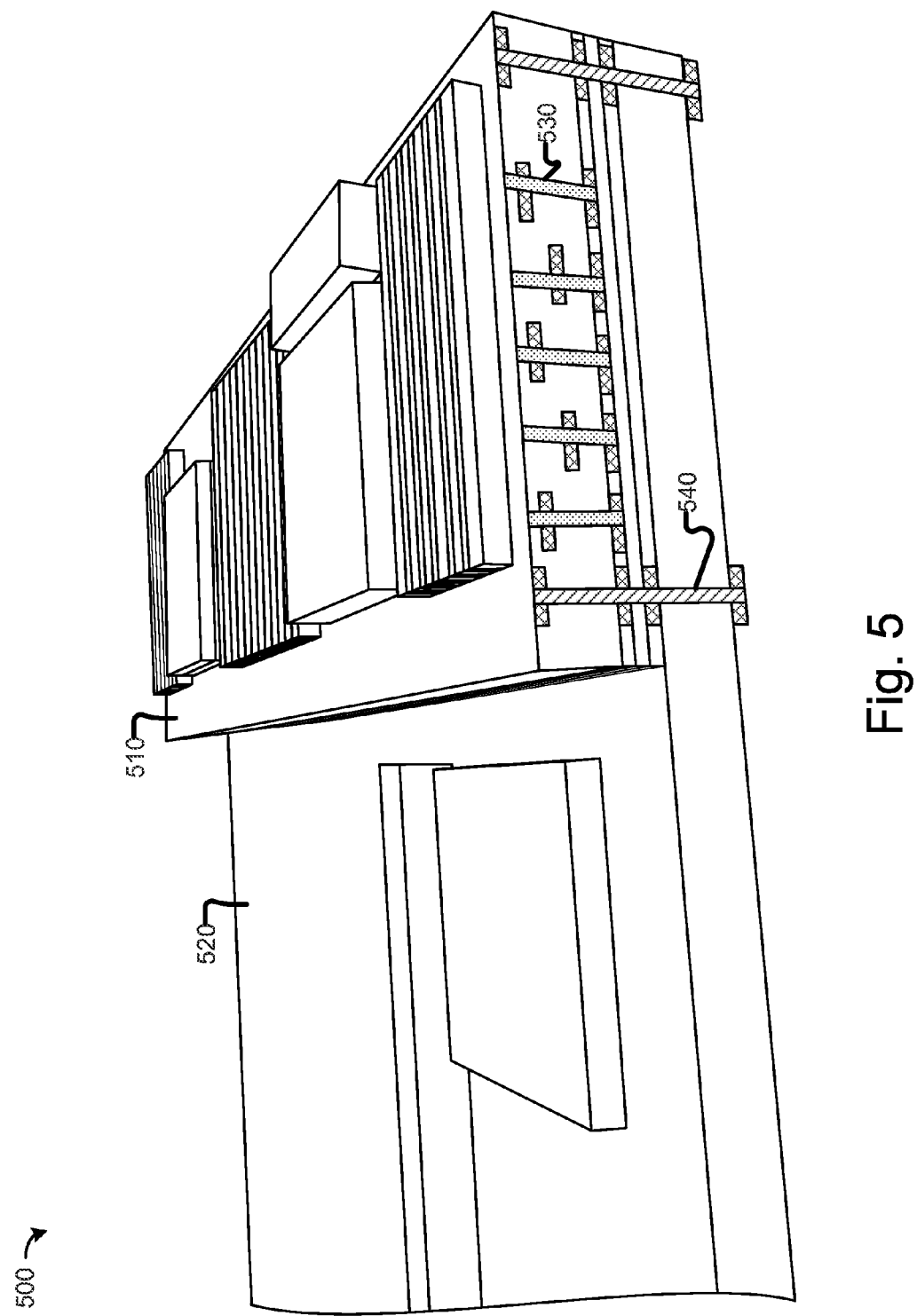
FIG. 5 is a schematic diagram of at least another embodiment of a computing device having a modular PCB incorporating aspects of the present disclosure, in accordance with various embodiments.

Referring now to FIG. 4 to FIG. 6, several embodiments of a computing device having a modular PCB, incorporating aspects of the present disclosure, are shown and described below. Modular PCB 400 may include processor module 410 and IO module 420. In various embodiments, processor module 410 may include processor 432, memory 436, and voltage regulator 434 secured on substrate 412. IO module 420 may include BMC 442, PCH 444, and PCI 446 hosted on substrate 422. Either substrate 412 or substrate 422 may have a multiple-layered profile.

In various embodiments, processor module 410 and IO module 420 may be bonded together based on bonding layer 450. In some embodiments, bonding layer 450 may include pre-preg material with epoxy resin, wherein the fibers and the epoxy resin may form a weave to bond adjacent materials together. Additionally, one or more mass lamination registration holes 414 may be utilized to align the shared lamination via patterns on processor module 410 and IO module 420. In some embodiments, mass lamination registration holes may be off the final modular PCB to improve the board real estate utilization. In some embodiments, mass lamination registration holes may be buried in the board outline and still function as mounting holes.

In various embodiments, routing features may be manufactured to route signals between processor module 410 and IO module 420 after the modules are bonded together. As an example, a through hole may be drilled through processor module 410 and IO module 420 with respect to the modular PCB 400 to form via 460. In some embodiments, vias may be drilled from either processor module 410 or IO module 420. In some embodiments, vias may be drilled through one PCB module but not the other. Signals may then be routed through these cross-module vias after drilling and plating.

In various embodiments, utilizing modular PCB 400 may allow a PCB designer to design a server using a single input/output module (e.g., IO module 420) with a single-processor module (e.g., processor module 410) or a multiple-processor module (not shown). For example, as discussed above, the illustrative processor module 410 may include processor 432, memory 436, and voltage regulator 434 secured to substrate 412; and IO module 420 may include BMC 442, PCH 444, and PCI 446 secured to substrate 422. In other embodiments, processor module 410 may include additional voltage regulators or other components. Similarly, IO module 420 may include other IO interfaces, high-speed IO routing, platform controllers, or hardware controllers. In other embodiments, processor module 410 and/or IO module 420 may include more or fewer components than shown in FIG. 4.

In various embodiments, processor module 410 and IO module 420 may be manufactured in parallel since they are separate modules. Of course, it is not necessary for processor module 410 to be manufactured simultaneously with IO module 420. Indeed, either module may be manufactured in advance of the other, which provides the flexibility for the modules to be manufactured by different manufacturers according to a particular design.

In various embodiments, processor module 410 may be designed as a stand-alone board, which may be an eight-layer design for many modern processors. If signals must be routed from processor module 410 to IO module 420, such signals may be routed to vias connecting these two modules, such as via 460.

The loss characteristics of processor module 410 are not critical relative to that of the IO module 420 due to the lack of 5 GHz or greater signal routing within processor module 410. However, IO module 420 may include signals that operate at 5 GHz or greater. Thus, it is advantageous to separate a server baseboard into multiple PCBs so that the dielectric used in each PCB may be tailored to characteristics of the signals routed in each board. As an example, IO module 420 may require lower loss dielectric than processor module 410.

Another advantage for separating a server baseboard into multiple PCBs is that processor module 410, which usually contains complex design, may be reused for more than one IO module. Once a processor module is appropriately designed, the level of signal interference between the processor module and an IO module can be low enough such that the processor module may be reused for various IO modules. Therefore, the need to test or calibrate the performance of the processor module for each different IO module may be mitigated because one successful designed processor module 410 may be reused to adapt to different IO modules or different types of servers, for example, manufactured by different downstream manufacturers. Such improved reusability may result in a quicker design time and reduced overall cost of the server PCB design. As an example, modular PCB design may be up to three times less expensive than using blind and buried vias on a server-class platform. On the other hand, consumers may also be benefited for recycling the complex processor module 410 for an upgraded IO module in the future.

In various embodiments, a modular PCB design may reduce the routing topology complexity. For example, a modular PCB design may reduce coupling between processor and IO signaling or between memory traces and IO routing. As another example, a modular PCB design may allow shorter via stubs on high-speed signal routing. Further, signals may be routed between processor module 410 and IO module 420 without going through any connectors. Thus, a modular PCB design may avoid complex routing topologies when signals among processor, memory, VRs, etc. are all routed in the same area. Additionally, a modular PCB design may allow for product designs where no power or memory vias from processor module 410 are routed to IO module 420, which may dramatically decrease the total processor baseboard area in some embodiments.

Referring now to FIG. 5, in another embodiment, an incomplete blind via technique may be used after bonding processor module 510 to IO module 520. In some embodiments, processor module 510 may be plated first before the process to bond processor module 510 to IO module 520. Similar to the above discussion, one or more lamination pins (not shown) may be used to align the processor module 510 with IO module 520. After processor module 510 is bonded with IO module 520, blind via 530, which is exposed only on the side of processor module 510, may be drilled and made conductive, e.g., by electroplating. Similarly, via 540, which goes through both modules with respect to the modular PCB 500, may also be drilled and plated.

Referring now to FIG. 6, in another embodiment, processor module 610 and/or the IO module 620 may utilize blind vias, for example, when a dense routing of signals in either processor module 610 or the IO module 620 may be required. As shown, via 630 only extends within processor module 610, while via 640 extends from IO module 620 to processor module 610 without extending all of the way through processor module 610. In some embodiments, via 640 may be manufactured as through holes in IO module 620 during manufacture of IO module 620. In other embodiments, via 640 may be drilled after the bonding process, which bonds the two modules together. In various embodiments, the resulting via 630 or 640 becomes a blind via with respect to the modular PCB 600.

Figure 7:
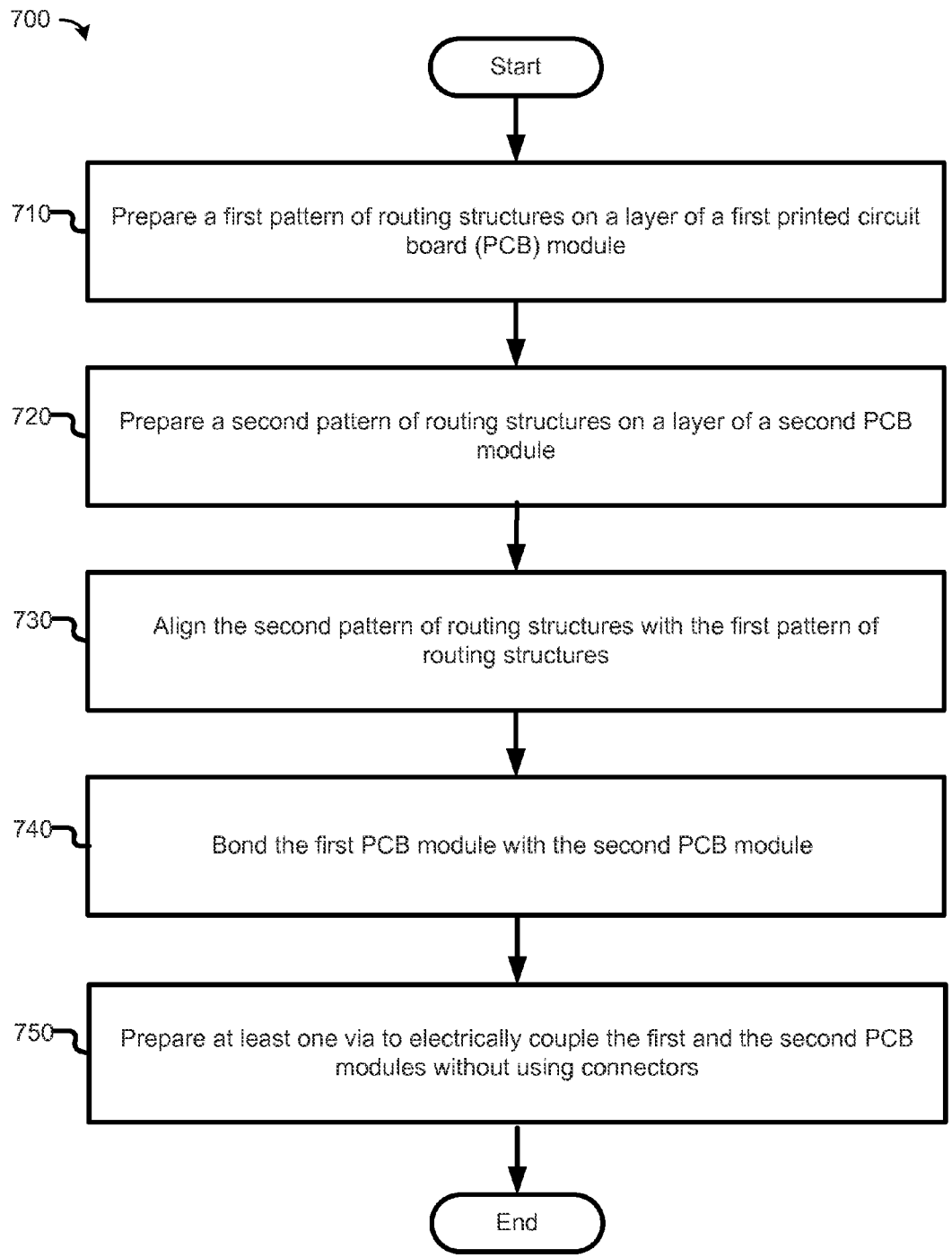
FIG. 7 is a flow diagram of an example process for producing a modular PCB, incorporating aspects of the present disclosure, in accordance with various embodiments.

FIG. 7 is a flow diagram of an example process for producing a modular PCB, incorporating aspects of the present disclosure, in accordance with various embodiments. As shown, process 700 may be performed to produce one or more embodiments of a computing device with at least one modular PCB according to the present disclosure.

In embodiments, the process may begin at block 710, where a first pattern of routing structures may be prepared on a layer of a first printed circuit board (PCB) module. In embodiments, the first pattern of routing structures may include a lamination via pattern, which may be predetermined based on a server design. In embodiments, the first pattern of routing structures may also include trenches or other routing structures. In embodiments, the first PCB module may include one or more processors, memory, and/or VRs.

Next, at block 720, a second pattern of routing structures may be prepared on a layer of a second PCB module. In embodiments, the second pattern of routing structures may include a lamination via pattern corresponding to the lamination via pattern formed on the first PCB module. Therefore, respective via pads of the first and second pattern of routing structures may be paired.

Next, at block 730, the second pattern of routing structures may be aligned with the first pattern of routing structures. In embodiments, respective mass lamination registration holes from the first and second PCB modules may be aligned together using mass lamination pins. Subsequently, the lamination via patterns on the two PCB modules may be in registry with each other, e.g., via pads on two PCB modules may be paired with each other.

Next, at block 740, the first PCB module may be bonded with the second PCB module. In embodiments, a layer of pre-impregnated composite fibers with epoxy resin may be used to bond the first PCB module with the second PCB module. In a bonding process, the fibers and the epoxy resin may bond adjacent materials together under a heated and pressured environment.

Next, at block 750, at least one via may be prepared to electrically couple the first and the second PCB modules without using connectors, e.g., by way of drilling and electroplating. Electrical interconnects or connectors are commonly used to connect two or more electronic components together. As an example, two PCB modules may be electrically connected using various means of electrical connectors, such as electrical wiring, solder balls, solder bumps, metal springs, etc. As used in this disclosure, connectors do not include electroplating. In embodiments, blind vias or through-hole type of vias may be drilled and plated from either the first or second PCB module, for example, as illustrated in connection with FIG. 4 to FIG. 6. In embodiments, via pads on the first PCB module may be connected to respective via pads on the second PCB module without any connectors, e.g., by drilling and electroplating vias to electrically couple aligned pads together. Therefore, signals may be routed among multiple PCB modules in a modular PCB or be further routed within each PCB module.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Illustrative examples of the devices, systems, and methods of various embodiments disclosed herein are provided below. An embodiment of the devices, systems, and methods may include any one or more, and any combination of, the examples described below.

Example 1 is a PCB, which may include a first PCB module with a first pattern of routing structures on one or more layers of the first PCB module; and a second PCB module with a second pattern of routing structures, on one or more layers of the second PCB module, aligned with and electrically coupled to the first pattern of routing structures without connectors.

Example 2 may include the subject matter of Example 1, and may further specify that a surface area of an outermost layer of the first PCB module is smaller than a surface area of an outermost layer of the second PCB module.

Example 3 may include the subject matter of Example 1 or 2, and may further specify that the first PCB module has higher signal routing density or higher power density than the second PCB module.

Example 4 may include any one of the subject matter of Examples 1-3, and may further specify that first PCB module is configured to handle signal that operate below five gigahertz, and the second PCB module is configured to handle signal that operate at or above five gigahertz.

Example 5 may include any one of the subject matter of Examples 1-4, and may further specify that the first PCB module comprises a first PCB material with a first loss factor; and the second PCB module comprises a second PCB material with a second loss factor that is lower than the first loss factor.

Example 6 may include any one of the subject matter of Examples 1-5, and may further specify that a layer count of the first PCB module is greater than a layer count in the second PCB module.

Example 7 may include any one of the subject matter of Examples 1-6, and may further specify that the first PCB module is secured to the second PCB module based at least in part on a bonding layer having pre-impregnated fiberglass and resin.

Example 8 may include any one of the subject matter of Examples 1-7, and may further specify that the first PCB module is electrically coupled to the second PCB module based on a plurality of vias connecting the first pattern of routing structures to the second pattern of routing structures.

Example 9 may include any one of the subject matter of Examples 1-8, and may further specify that the first pattern of routing structures and the second pattern of routing structures share a common lamination via pattern.

Example 10 may include any one of the subject matter of Examples 1-9, and may further specify that the first pattern of routing structures comprises a plurality of first via pads, and the second pattern of routing structures comprises a plurality of second via pads, and wherein each via pad of the plurality of first via pads is coupled to a respective via pad of the plurality of second via pads.

Example 11 may include any one of the subject matter of Examples 1-10, and may further include at least one via that extends through the first PCB module and through the second PCB module.

Example 12 may include any one of the subject matter of Examples 1-11, and may further the PCB has at least two regions with different heights.

Example 13 may include any one of the subject matter of Examples 1-12, and may further specify that the first PCB module comprises a processor module and a memory module, and the second PCB module comprises an input/output module and a baseboard management controller.

Example 14 is a method for producing a modular PCB, which may include preparing a first pattern of routing structures on a layer of a first printed circuit board (PCB) module and a second pattern of routing structures on a layer of a second PCB module; and bonding the first PCB module and the second PCB module together based at least in part on pre-impregnated fiberglass and resin to electrically couple the second pattern of routing structures to the first pattern of routing structures without connectors.

Example 15 may include the subject matter of Example 14, and may include aligning the second pattern of routing structures with the first pattern of routing structures based at least in part on a registration hole.

Example 16 may include the subject matter of Example 14 or 15, and may further include drilling and plating at least one via going through the first PCB module and through the second PCB module.

Example 17 may include any one of the subject matter of Examples 14-16, and may further include drilling and plating at least one blind via, from the first PCB module and to be used only within the first PCB module, or from the second PCB module and to be used only within the second PCB module.

Example 18 may include any one of the subject matter of Examples 14-17, and may further specify that the first pattern of routing structures and the second pattern of routing structures share a common lamination via pattern.

Example 19 may include any one of the subject matter of Examples 14-18, and may further specify that the first PCB module comprises a processor module and a memory module, and the second PCB module comprises an input/output module and a baseboard management controller.

Example 20 is a computing device, which may include a processor module having a central processing unit and a memory secured to a first printed circuit board (PCB) substrate, the first PCB substrate including a first lamination via pattern defined on a bottom side; and an input/output module having a hardware controller secured to a second PCB substrate, the second PCB substrate including a second lamination via pattern defined on a top side; wherein the first lamination via pattern is secured to and electrically coupled with the second lamination via pattern without connectors.

Example 21 may include the subject matter of Example 20, and may further specify that the processor module further comprises at least one voltage regulator to provide a regulated voltage to the central processing unit or the memory.

Example 22 may include the subject matter of Example 20 or 21, and may further specify that the second lamination via pattern is arranged in a mirror image of the first lamination via pattern.

Example 23 may include any one of the subject matter of Examples 21-22, and may further specify that the first lamination via pattern comprises a plurality of first via pads and the second lamination via pattern comprises a plurality of second via pads, and wherein each via pad of the plurality of first via pads is coupled to a corresponding via pad of the plurality of second via pads.

Example 24 may include any one of the subject matter of Examples 21-23, and may further specify that the first PCB substrate comprises a first PCB material with a first loss factor; and the second PCB substrate comprises a second PCB material with a second loss factor that is lower than the first loss factor.

Example 25 may include any one of the subject matter of Examples 21-24, and may further specify that the hardware controller includes a baseboard management controller.

We claim:

1. A printed circuit board (PCB) arrangement for server computing, comprising:
   a first PCB module with a first pattern of routing structures on one or more layers of the first PCB module which hosts a central processing unit and a memory, the first PCB module being void of input/output components;
   a second PCB module with a second pattern of routing structures, on one or more layers of the second PCB module, aligned with and electrically coupled to the first pattern of routing structures without connectors and hosting a plurality of input/output components, the second PCB module being void of central processing unit and memory components, wherein the first pattern of routing structures includes first structures electrically coupling to second structures included in the second pattern of routing structures; and
   a bonding layer which bonds the first and second PCB modules together and forms a server computer platform.

2. The PCB of claim 1, wherein a surface area of an outermost layer of the first PCB module is smaller than a surface area of an outermost layer of the second PCB module.

3. The PCB of claim 1, wherein the first PCB module has higher signal routing density or higher power density than the second PCB module.

4. The PCB of claim 1, wherein the first PCB module is configured to handle signals that operate below five gigahertz, and the second PCB module is configured to handle signals that operate at or above five gigahertz.

5. The PCB of claim 1, wherein the first PCB module comprises a first PCB material with a first loss factor; and the second PCB module comprises a second PCB material with a second loss factor that is lower than the first loss factor.

6. The PCB of claim 1, wherein a layer count of the first PCB module is greater than a layer count of the second PCB module.

7. The PCB of claim 1, wherein the first PCB module is secured to the second PCB module based at least in part on the bonding layer having pre-impregnated fiberglass and resin.

8. The PCB of claim 1, wherein the first PCB module is electrically coupled to the second PCB module based on a plurality of vias connecting the first pattern of routing structures to the second pattern of routing structures.

9. The PCB of claim 1, wherein the first pattern of routing structures and the second pattern of routing structures share a common lamination via pattern.

10. The PCB of claim 1, wherein the first pattern of routing structures comprises a plurality of first via pads, and the second pattern of routing structures comprises a plurality of second via pads, and wherein each via pad of the plurality of first via pads is coupled to a respective via pad of the plurality of second via pads.

11. The PCB of claim 1, further comprising at least one via that extends through the first PCB module and through the second PCB module.

12. The PCB of claim 1, wherein the PCB has at least two regions with different heights.

13. The PCB of claim 1, wherein the central processing unit hosted on the first PCB module is for executing instructions included in the memory.

14. The PCB of claim 1, wherein the input/output components of the second PCB module comprise a baseboard management controller, a platform controller hub, or a peripheral interconnect.

* * * * *